United States Patent
Bal et al.

(10) Patent No.: US 12,316,731 B2
(45) Date of Patent: May 27, 2025

(54) DEVICE WITH LOW-POWER SYNCHRONIZING CIRCUITRY AND RELATED METHOD

(71) Applicant: STMicroelectronics International N.V., Geneva (CH)

(72) Inventors: Ankur Bal, Greater Noida (IN); Namerita Khanna, New Delhi (IN); Rajnish Garg, Noida (IN); Rohit Kumar Gupta, Noida (IN)

(73) Assignee: STMicroelectronics International N.V., Geneva (CH)

( * ) Notice: Subject to any disclaimer, the term of this patent is extended or adjusted under 35 U.S.C. 154(b) by 99 days.

(21) Appl. No.: 17/898,239

(22) Filed: Aug. 29, 2022

(65) Prior Publication Data

US 2023/0062144 A1    Mar. 2, 2023

Related U.S. Application Data

(60) Provisional application No. 63/238,679, filed on Aug. 30, 2021.

(51) Int. Cl.
*H04L 7/033* (2006.01)
*H03K 3/037* (2006.01)
*H03K 19/21* (2006.01)

(52) U.S. Cl.
CPC .......... *H04L 7/0337* (2013.01); *H03K 3/037* (2013.01); *H03K 19/21* (2013.01)

(58) Field of Classification Search
CPC ...... H04L 7/0337; H03K 3/037; H03K 19/21; G06F 1/12
See application file for complete search history.

(56) References Cited

U.S. PATENT DOCUMENTS

| | | | |
|---|---|---|---|
| 7,712,062 B2 | 5/2010 | Ly et al. | |
| 8,212,594 B2 | 7/2012 | Singhal et al. | |
| 8,898,502 B2 | 11/2014 | Maddigan et al. | |
| 9,325,487 B1 * | 4/2016 | Paul | H03K 19/003 |
| 10,055,193 B2 | 8/2018 | Skoglund et al. | |
| 10,075,153 B2 | 9/2018 | Shin et al. | |

(Continued)

FOREIGN PATENT DOCUMENTS

CN    109842406 B    3/2021

OTHER PUBLICATIONS

English translation of CN 109842406 B1 (Year: 2021).*

*Primary Examiner* — Sam K Ahn
*Assistant Examiner* — Amneet Singh
(74) *Attorney, Agent, or Firm* — Seed IP Law Group LLP

(57) ABSTRACT

A device includes input data lines associated with a first time domain and output data lines associated with a second time domain. Synchronizing circuitry is coupled between the input data lines and output data lines. The synchronizing circuitry is driven by a synchronizing clock signal generated by clock generating circuitry. The clock generating circuitry is coupled to the input data lines and the synchronizing circuitry. In operation, the clock generating circuitry detects signal transitions on the plurality of input data lines. The clock generating circuitry generates the synchronizing clock signal that drives the synchronizing circuitry based on detected transitions, a clock signal of the first time domain, and a clock signal of the second time domain.

20 Claims, 6 Drawing Sheets

(56) References Cited

U.S. PATENT DOCUMENTS

| | | | |
|---|---|---|---|
| 2006/0091912 A1* | 5/2006 | Ghosh | G06F 1/12 |
| | | | 326/93 |
| 2012/0038398 A1* | 2/2012 | Singhal | G06F 5/06 |
| | | | 327/153 |
| 2017/0214514 A1* | 7/2017 | Manohar | H04L 7/0037 |
| 2017/0230038 A1* | 8/2017 | Shin | H04L 7/0331 |

* cited by examiner

DEVICE WITH LOW-POWER SYNCHRONIZING CIRCUITRY AND RELATED METHOD

BACKGROUND

Technical Field

The present disclosure is related to integrated circuits, and more particularly, to communication between subsystems of integrated circuits.

Description of the Related Art

A system on a chip (SoC) includes subsystems implemented in a single integrated circuit. In some cases, one subsystem of the SoC is configured to provide data to the second subsystem of the SoC. Within each subsystem of the SoC, circuits of the subsystem operate synchronously in time according to respective clock signals. When circuitry of each of the subsystems of the SoC is timed to a different clock signal, metastability may arise during data transfer between two subsystems of the SoC. Synchronizers are circuits that are deployed near clock domain boundaries to reduce the occurrence of metastability. Clock domain boundaries are present between subsystems of a single SoC or between one SoC and another SoC of an electronic device.

BRIEF SUMMARY

In an embodiment, clock generating circuitry drives synchronizing circuitry based on detected transitions in data signals. Synchronizing circuitry is coupled between input data lines associated with a first time domain and output data lines associated with a second time domain. The clock generating circuitry is coupled to the input data lines and the synchronizing circuitry, and generates a synchronizing clock signal that drives the synchronizing circuitry based on detected transitions, a clock signal of the first time domain, and a clock signal of the second time domain. The clock generating circuitry detects signal transitions on the input data lines.

In one embodiment, first functional circuitry of a system transmits signals to second functional circuitry of the system. The first functional circuitry is associated with a first time domain. The second functional circuitry is associated with a second time domain. A synchronizing interface has synchronizing elements coupled between the first functional circuitry and the second functional circuitry. The synchronizing interface detects signal transitions of the signals, and generates a synchronizing clock signal to drive the synchronizing elements based on detected transitions and clock signals associated with the first and second time domains.

In one embodiment, data is transmitted between first circuitry associated with a first time domain and second circuitry associated with a second time domain using a data interface. In the transmitting, signal transitions associated with the data are detected, and a synchronizing clock signal is generated to drive the data interface based on detected signal transitions, a clock signal associated with the first time domain, and a clock signal associated with the second time domain.

BRIEF DESCRIPTION OF THE SEVERAL VIEWS OF THE DRAWINGS

Reference will now be made by way of example only to the accompanying drawings. In the drawings, identical reference numbers identify similar elements or acts, and reference numbers identical but for a different suffix identify similar elements or acts, unless the context indicates otherwise. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

Figure 1:
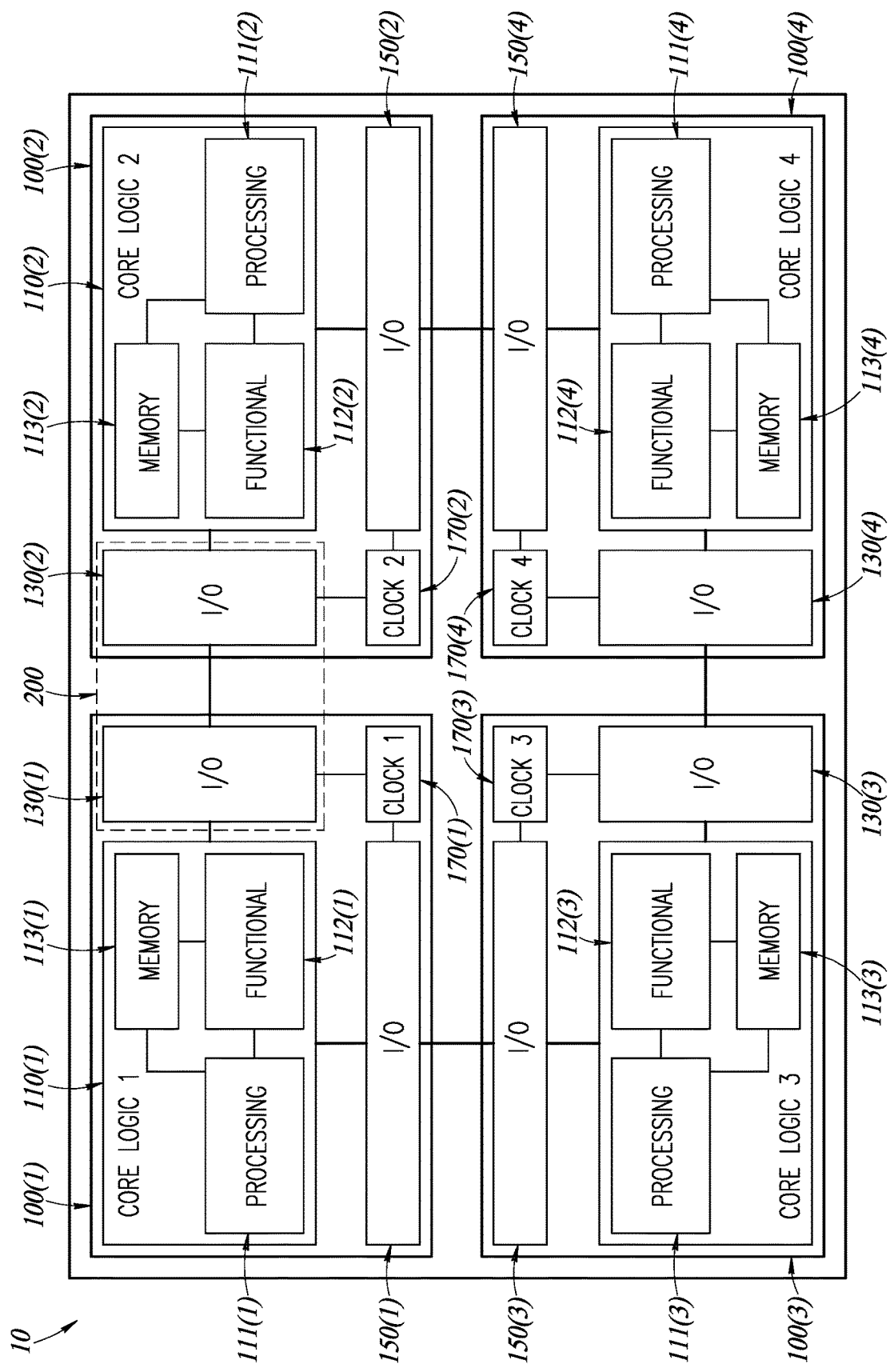
FIG. 1 is a schematic diagram of a system including a synchronizing interface in accordance with various embodiments.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Signal synchronizers are deployed in digital designs to address metastability issues arising due to signals crossing clock domain boundaries. Such signals are usually large in number at system on a chip (SoC) or intellectual property (IP) boundaries, and contribute to parasitic power dissipation. This power loss can be significant in battery powered devices. As an example, a central processing unit (CPU)

operating at 1 GHz may be in communication with a camera module operating at 100 MHz. The camera module may communicate configuration settings such as operation mode (e.g., photo, panorama, black and white) to the CPU very infrequently. As such, when the camera is not in use or is operated continuously in a single operation mode, the domain crossing synchronizers waste significant battery power.

Embodiments of the disclosure generate a gated clock to drive a bank of synchronizers coupled between input data lines and output data lines. The gate clock is enabled for a short period following detection of a signal transition at the input data lines, then disabled once the signal transition has been latched by the synchronizers. Significant power savings may be achieved, particularly in an operating environment in which signals change sparsely across clock domains.

FIG. 1 is a schematic diagram of a system 10, according to one embodiment. The system 10 includes a first subsystem 100(1), a second subsystem 100(2), a third subsystem 100(3) and a fourth subsystem 100(4), which may be referred to collectively as "the subsystems 100." The first subsystem 100(1) and the fourth subsystem 100(4) each transmit data to the second subsystem 100(2) and the third subsystem 100(3). As will be set forth in more detail below, a synchronizing data interface 200 (or, "synchronizing interface") detects transitions in the data transmitted from the first subsystem 100(1) to the second subsystem 100(2), and drives synchronizing circuitry 134(2) (see FIG. 2) based on detected transitions.

The system 10 is or includes a system-on-a-chip (SoC). Each of the subsystems 100 may be an SoC, an application-specific integrated circuit (ASIC), a circuit IP of an SoC or ASIC, or other similar arrangement of circuit elements. Accordingly, each of the subsystems 100 may be or include various functional circuitry, such as analog-to-digital converters (ADC), digital-to-analog converters (DAC), microprocessors, memory, memory controllers, bus controllers, digital signal processors, low-voltage differential signaling (LVDS), wireless receivers, wireless transmitters, image sensors, touch controllers, fingerprint sensors and other types of functional circuitry. Some of the subsystems provide data to other subsystems. Embodiments of the present disclosure help facilitate transmission of data effectively from one subsystem to another while consuming little power between sparse data transitions. While FIG. 1 illustrates four subsystems 100, in practice, the integrated circuit 110 may include fewer or more subsystems, such as those described above, or others.

The first subsystem 100(1) includes a first clock generator 170(1). The first clock generator 170(1) generates a first clock signal CLK1 (see FIG. 3). The first clock generator 170(1) may include a voltage controlled oscillator (VCO), a current controlled oscillator, a ring oscillator, or other types of oscillators that can generate a clock signal. The first clock generator 170(1) may generate the first clock signal CLK1 from a global clock signal of the system 10. In this case, the system 10 may include a global clock generator, such as a crystal oscillator or other type of clock generator, that generates the clock signal with a frequency on which the clock signals of the various subsystems are based. Accordingly, the first clock generator 170(1) may receive the global clock signal and generate CLK1 based on the global clock signal. The first clock signal CLK1 may have the same frequency as the global clock signal. The first clock signal CLK1 may be the global clock signal.

The first clock signal CLK1 is the clock signal on which the basic functions of the first subsystem 100(1) are performed. The first subsystem 100(1) includes other circuitry associated with a primary function of the first subsystem. In an example in which the first subsystem 100(1) is a mobile processor, the first subsystem 100(1) may include processing circuitry 111(1), functional circuitry 112(1) and memory 113(1) that operate under control of the first clock signal CLK1 generated by the first clock generator 170(1).

Each of the subsystems 100 is illustrated having similar circuitry in FIG. 1. In practice, certain of the subsystems 100(1)-100(4) may include one or more of processing circuitry 111(1)-111(4), functional circuitry 112(1)-112(4), memory 113(1)-113(4), data interfaces 130(1)-130(4), 150(1)-150(4) and clock generators 170(1)-170(4), respectively. In an example in which the fourth subsystem 100(4) is an ADC, the functional circuitry 112(4) may perform functions of converting analog signals to digital signals, and the processing circuitry 111(4) and the memory circuitry 113(4) may be omitted. Each of the subsystems 100(1)-100(4) may include other types of circuitry not illustrated in FIG. 1 for simplicity. Each of the processing circuitry 111(1)-111(4), functional circuitry 112(1)-112(4), memory 113(1)-113(4), data interfaces 130(1)-130(4), 150(1)-150(4) and clock generators 170(1)-170(4) may be referred to collectively as processing circuitry 111, functional circuitry 112, memory 113, data interfaces 130, 150 and clock generators 170, respectively.

The second subsystem 100(2) includes second clock generator 170(2). The second clock generator 170(2) generates a second clock signal CLK2 (see FIG. 3). The second clock generator 170(2) can include a VCO, a current control oscillator, a ring oscillator, or other types of oscillators that can generate a clock signal. The second clock generator 170(2) may generate a second clock signal CLK2 from the global clock signal of the integrated circuit 110 as described in relation to the generation of the first clock signal CLK1. The second clock generator 170(2) may receive the global clock signal and generate CLK2 based on the global clock signal. The second clock signal CLK2 may have the same frequency as the global clock signal. The second clock signal CLK2 may be the global clock signal.

The first clock signal CLK1 and the second clock signal CLK2 may have the same or different frequency. However, the first and second clock signals CLK1 and CLK2 may be out of phase with each other by an amount that may be unknown and changing over time due to operating conditions of the system 10. Metastability may occur in the presence of simultaneous transitions of the first clock signal CLK1 and the second clock signal CLK2. Mitigation of metastability may be accomplished through use of synchronizers placed in a signal path between the data interface 130(1) and the data interface 130(2). The data interfaces 130(1), 130(2) may be collectively referred to as the synchronizing data interface 200, which is highlighted in phantom in FIG. 1. If data transitions are infrequent on the signal path, the synchronizers may waste significant power if left running between data transitions. Embodiments of the disclosure are described below that include transition detecting circuitry and gating circuitry that enable the synchronizers for a brief period following detected transitions, then disable the synchronizers to save power until a subsequent transition is detected.

Figure 2:
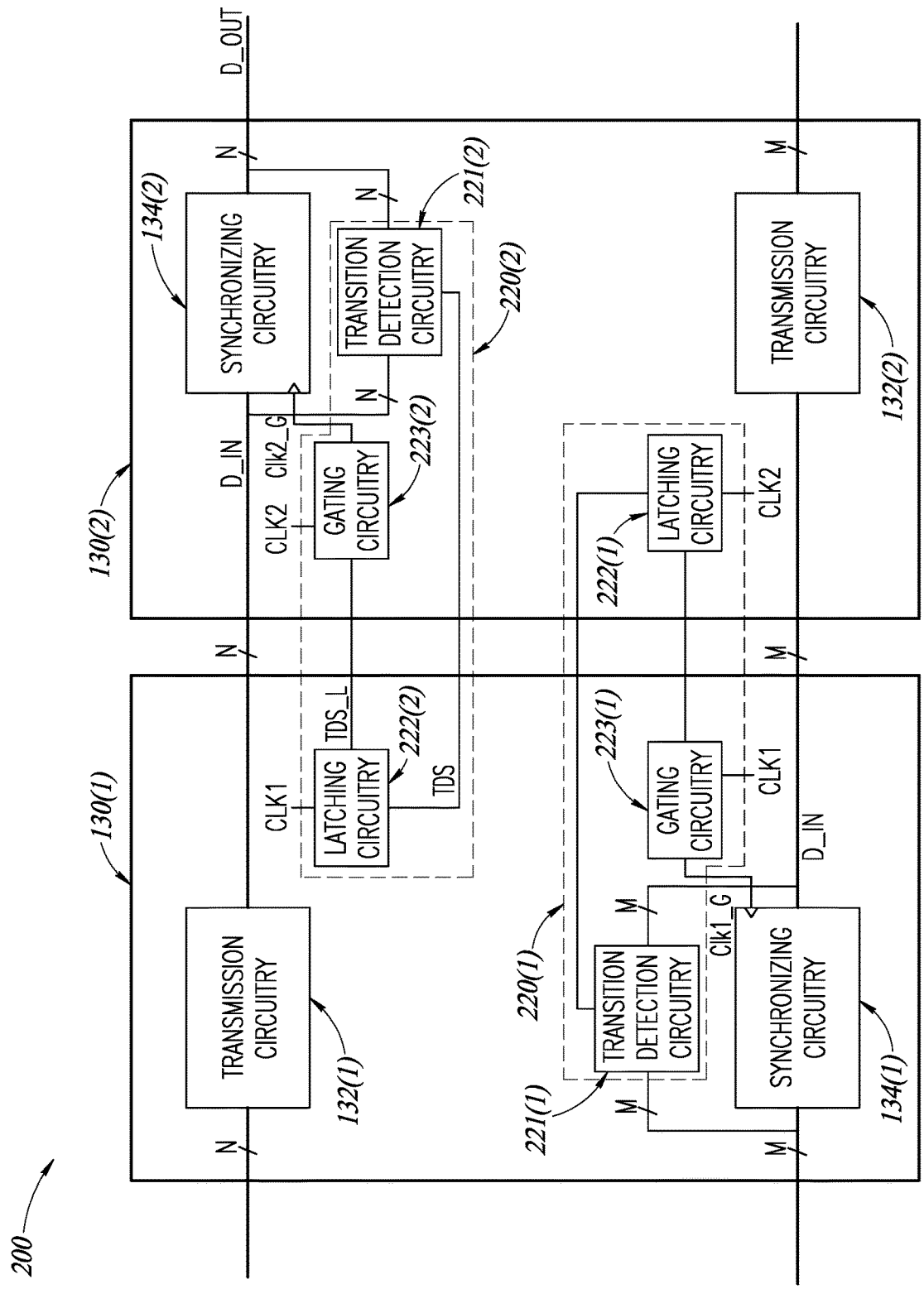
FIG. 2 is a schematic diagram of a synchronizing interface in accordance with various embodiments.

FIG. 2 is a schematic diagram showing the synchronizing data interface 200 in accordance with various embodiments. The data interfaces 130(1), 130(2) include transmission circuitry 132(1), 132(2) and synchronizing circuitry 134(1), 134(2), respectively. In one example, the transmission circuitry 132(1), 132(2) includes flip-flops that each include a clock terminal, a data input terminal, and a data output terminal. The data received at the input terminal will typically be provided to the output terminal upon the next rising edge of the clock signal received at the input terminal.

The transmission circuitry 132(1) outputs N-bit data to the data interface 130(2). The transmission circuitry 132(2) outputs M-bit data to the data interface 130(1). "M" and "N" are integers of value 1 or greater, such as 8, 16, 256, or other value. "M" and "N" may have the same value or different values. The N-bit and M-bit data may include one or more of port enable/disable signals, handshake signals, interrupt signals, configuration data signals (e.g., operating mode(s) of an image sensor) or the like, and various combinations thereof. The N-bit data and the M-bit data may each include data words, such as 8-bit words, 16-bit words, or the like. In many practical environments, the M-bit and N-bit data change infrequently, such that many clock cycles of the first clock signal CLK1 and the second clock signal CLK2 pass between transitions in data signals carrying the M-bit and N-bit data. A data signal D_IN is labeled in FIG. 2 that is transmitted from the transmission circuitry 132(1) to the data interface 130(2). The data signal D_IN may be an input data signal to the synchronizing circuitry 134(2) of the data interface 130(2). The data signal D_IN may be synchronized to a first time domain of the first subsystem 100(1) governed by the first clock generator 170(1).

The synchronizing circuitry 134(1), 134(2) receive and synchronize the M-bit data and the N-bit data, respectively. Description of the synchronizing circuitry 134(1), 134(2) is given with reference to the synchronizing circuitry 134(2) below, with the understanding that the synchronizing circuitry 134(1) may include generally the same configuration and operating principles while operating in the first time domain of the first subsystem 100(1). The synchronizing circuitry 134(2) outputs an output data signal D_OUT that carries the same data as the input data signal D_IN shifted in time and synchronized from the first time domain of the first subsystem 100(1) to a second time domain of the second subsystem 100(2) governed by the second clock generator 170(2). The synchronizing circuitry 134(2) receives a gated clock signal Clk2_G that has the same frequency as the second clock signal CLK2. As shown in FIG. 2, the synchronizing circuitry 134(1) may receive a gated clock signal Clk1_G that has the same frequency as the first clock signal CLK1. The gated clock signals Clk1_G, Clk2_G drive the synchronizing circuitry 134(1), 134(2), respectively, and may be referred to as synchronizing clock signals.

The synchronizing clock signals Clk1_G, Clk2_G are generated by clock generating circuitry 220(1), 220(2), respectively. The clock generating circuitry 220(2) is described in detail, and the clock generating circuitry 220(1) may have similar structure and function as the clock generating circuitry 220(2) while time domains of circuit elements thereof are reversed. For example, similar circuit elements that operate in the first time domain in the clock generating circuitry 220(2) operate in the second time domain in the clock generating circuit 220(1). The clock generating circuitry 220(2) detects transitions of the input data signal D_IN and generates the synchronizing clock signal Clk2_G based on detected transitions, the first clock signal CLK1 and the second clock signal CLK2.

Transition detection circuitry 221(2) of the clock generating circuitry 220(2) is coupled between input data lines that carry the input data signal D_IN and output data lines that carry the output data signal D_OUT. The transition detection circuitry 221(2) generates a transition detection signal TDS by logically combining the input data signal D_IN with the output data signal D_OUT. The transition detection circuitry 221(2) is asynchronous. As illustrated in FIG. 2, the transition detection circuitry 221(2) may be located in the second subsystem 100(2). In one embodiment, the transition detection circuitry 221(2) is located in the first subsystem 100(1).

Latching circuitry 222(2) of the clock generating circuit 220(2) is coupled to output of the transition detection circuitry 221(2), and receives the transition detection signal TDS at input of the latching circuitry 222(2). The latching circuitry 222(2) is associated with the first time domain, and receives the first clock signal CLK1 or a clock signal derived from the first clock signal CLK1. The latching circuitry 222(2) holds the transition detection signal TDS, and synchronizes the transition detection signal TDS to the first time domain, for example, by timing of the first clock signal CLK1. The latching circuitry 222(2) may output a latched transition detection signal TDS_L. The latching circuitry 222(2) may be separate from the transition detection circuitry 221(2), as shown. In one embodiment, the latching circuitry 222(2) is included in the transition detection circuitry 221(2).

Gating circuitry 223(2) of the clock generating circuit 220(2) is coupled to output of the transition detection 222(2), and receives the latched transition detection signal TDS_L at input of the gating circuitry 223(2). The gating circuitry 223(2) receives a clock signal of the second time domain, such as the second clock signal CLK2 or a clock signal having the same frequency as the second clock signal CLK2, for example, derived from the second clock signal CLK2. The gating circuitry 223(2) outputs the synchronizing clock signal Clk2_G. The synchronizing clock signal Clk2_G may be generated by the gating circuitry 223(2) by logically combining the second clock signal CLK2 with an enable signal derived from the latched transition detection signal TDS_L. Generation of the enable signal is described in greater detail with reference to FIG. 3.

The synchronizing clock signal Clk2_G begins toggling to drive the synchronizing circuitry 134(2) shortly following detection of a transition by the transition detection circuitry 221(2). Toggling of the synchronizing clock signal Clk2_G persists for a brief period corresponding to length of a signal pulse of the latched transition detection signal TDS_L during which the synchronizing circuitry 132(2) latches and synchronizes new data that triggered a transition. Following latching of the new data by the synchronizing circuitry 132(2), the input data signal D_IN matches the output data signal D_OUT, which toggles the transition detection signal TDS and, subsequently, toggles the enable signal. The synchronizing clock signal Clk2_G ceases toggling when the enable signal is in a logical state reflecting the match between the input data signal D_IN and the output data signal D_OUT.

Following stabilization of the output data signal D_OUT, a quick subsequent second transition in the input data signal D_IN (e.g., prior to an immediately following rising edge of the first clock signal CLK1) may cause the synchronizing clock signal Clk2_G to remain enabled until the output data signal D_OUT changes to reflect the second transition in the input data signal D_IN. The transition detection signal TDS may transition briefly due to the output data signal D_OUT matching the input data signal D_IN, then transition back again almost immediately upon the second transition due to the output data signal D_OUT being different from the input data signal D_IN. The latched transition detection signal TDS_L remains at its original logical state (e.g., high) when the latching circuitry 222(1) latches the transition detection signal TDS at the rising edge of the first clock signal CLK1. As such, the synchronizing clock signal Clk2_G may continue toggling without pausing through two or more rapid transitions of the input data signal D_IN.

Figure 3:
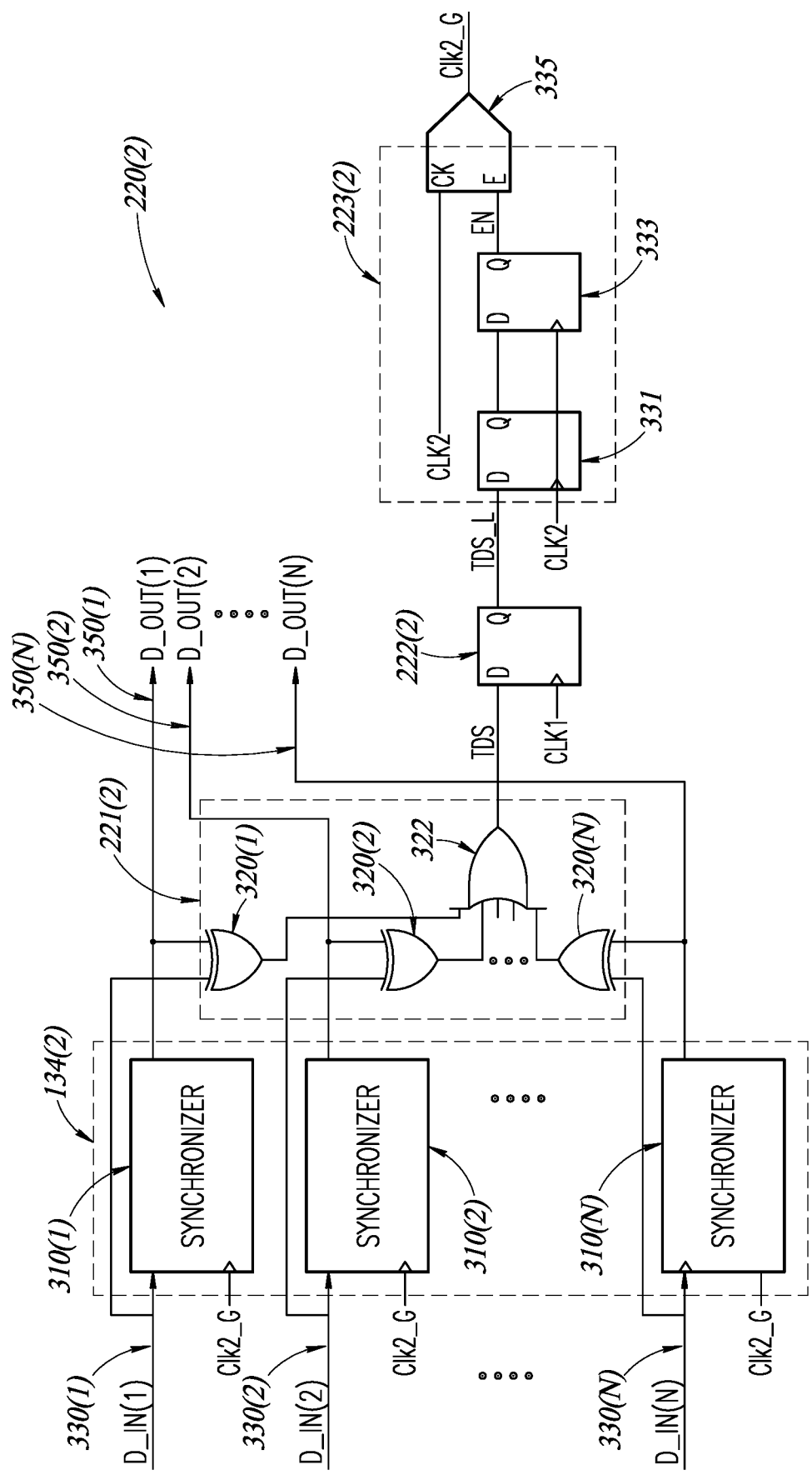
FIG. 3 is a detailed schematic diagram of a synchronizing interface in accordance with various embodiments.

FIG. 3 is a detailed schematic diagram of the synchronizing circuitry 134(2) and the clock generating circuitry 220(2) in accordance with various embodiments. Operation of the synchronizing circuitry 134(2) and the clock generating circuitry 220(2) are described with reference to a waveform diagram illustrated in FIG. 5 and a flow chart of a method 1000 illustrated in FIG. 6. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity.

The synchronizing circuitry 134(2) includes a bank of synchronizers 310(1)-310(N) (or, "synchronizing elements") coupled between input data lines 330(1)-330(N) and output data lines 350(1)-350(N), respectively. The number of synchronizers may correspond to (e.g., equal) the number of bits in the input data signal D_IN. The synchronizer 310(1) is described for illustrative purposes, and the synchronizers 310(2)-310(N) have a similar configuration and function as the synchronizer 310(1). The synchronizer 310(1) synchronizes a first bit D_IN(1) of the input data signal D_IN to the second time domain based on the synchronizing clock signal Clk2_G. An input of the synchronizer 310(1) is coupled to a first input data line 330(1), and an output of the synchronizer 310(1) is coupled to a first output data line 350(1).

Figures 4A, 4B:
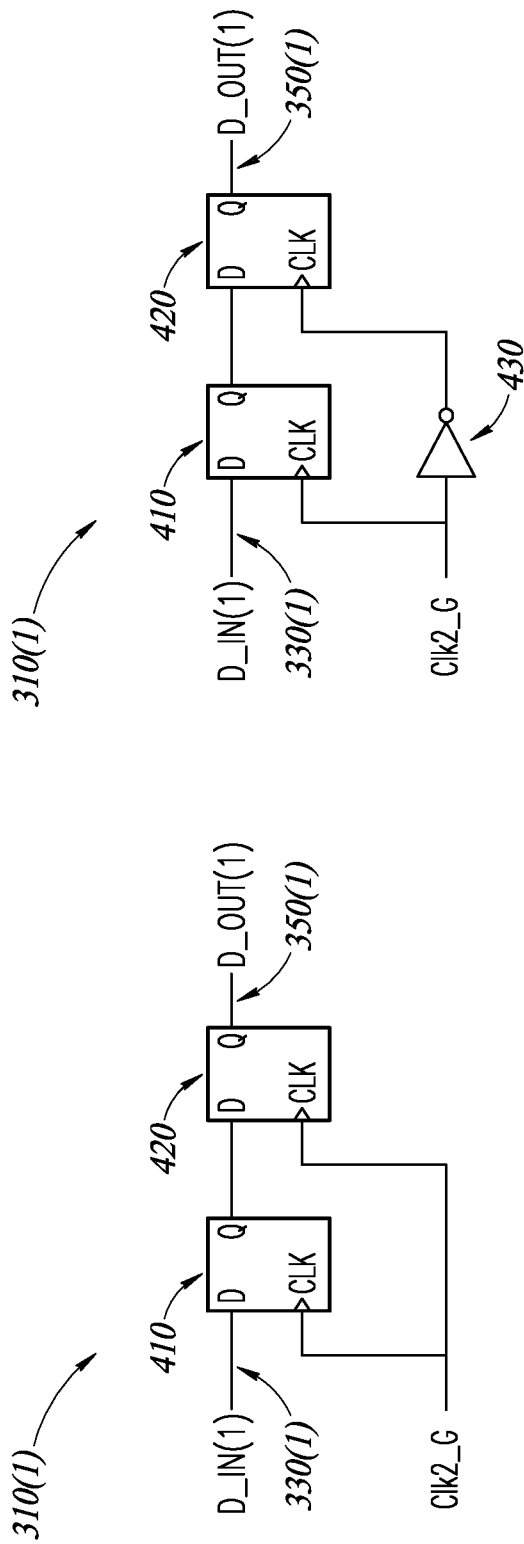
FIGS. 4A and 4B are schematic diagrams of synchronizers in accordance with various embodiments.

FIGS. 4A and 4B are detailed schematic diagrams of the synchronizer 310(1) in accordance with various embodiments. The synchronizer 310(1) may include two flip-flops 410, 420 coupled in series. Each flip-flop 410, 420 may include an input D and an output Q, and may have a clock input CLK. The input D of the flip-flop 410 is coupled to the first input data line 330(1). The input D of the flip-flop 420 is coupled to the output Q of the flip-flop 410. The output Q of the flip-flop 420 is coupled to the first output data line 350(1). In one embodiment, shown in FIG. 4A, the clock inputs CLK of the flip-flops 410, 420 are each coupled to output of the gating circuitry 223(1) to receive the synchronizing clock signal Clk2_G. In one embodiment, shown in FIG. 4B, the clock input CLK of the flip-flop 410 is coupled to the output of the gating circuitry 223(1) to receive the synchronizing clock signal Clk2_G, and the clock input CLK of the flip-flop 420 is coupled to an output of an inverter 430 to receive an inverse of the synchronizing clock signal Clk2_G. The synchronizer 310(1) illustrated in FIG. 4B may be referred to as a half-cycle synchronizer, as use of an inverted clock gains a half clock cycle in operation.

Figure 5:
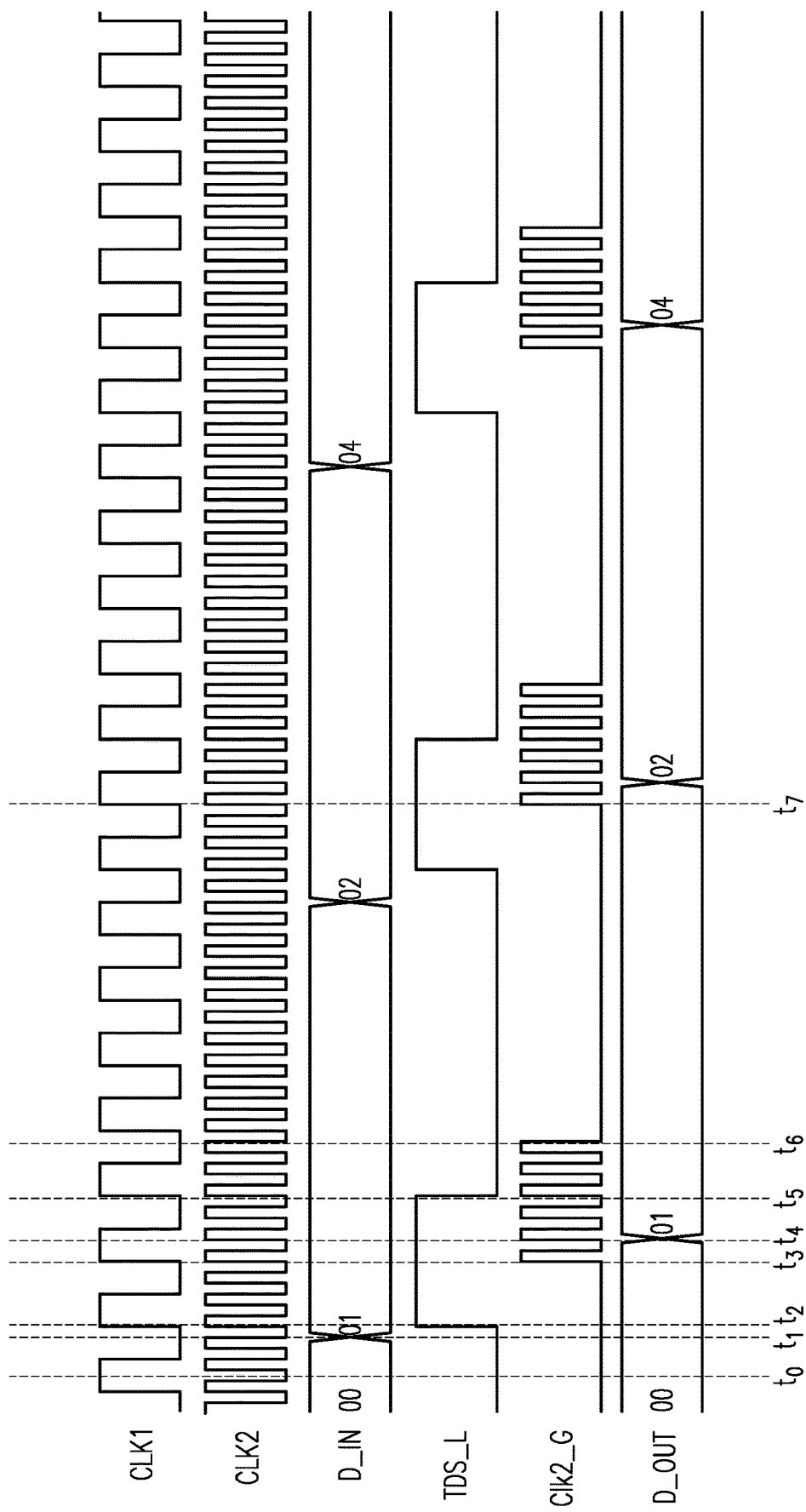
FIG. 5 is a waveform illustrating a method of synchronizing data signals in accordance with various embodiments.

Referring again to FIG. 3, and with reference to FIG. 5, reference is made to various electrical or logical states (e.g., "high voltage" and "low voltage," "logic high" and "logic low," or "1" and "0") in the description for illustration purposes. It should be appreciated that a variety of electrical or logical schemes are appropriate and considered herein. For example, the latched transition detection signal TDS_L may be considered "active" or "enabled" in periods (e.g., from time $t_2$ to time $t_5$) during which the latched transition detection signal TDS_L is at a high voltage, and may be considered "inactive" or "disabled" in periods during which the latched transition detection signal TDS_L is at a low voltage. In one embodiment, a low voltage may correspond to "active"/"enabled" and a high voltage may correspond to "inactive"/"disabled."

The input data signal D_IN has the same value "00" as the output data signal D_OUT at initial time $t_0$. The input data signal D_IN transitions at subsequent first time $t_1$. The transition detection signal TDS outputted by the transition detection circuitry 221(1) is low at the initial time $t_0$. Following a transition of the input data signal D_IN from "00" to "01" at the first time $t_1$, the transition detection signal TDS goes high, delayed slightly by propagation delay of logic gates of the transition detection circuitry 221(2).

Figure 6:
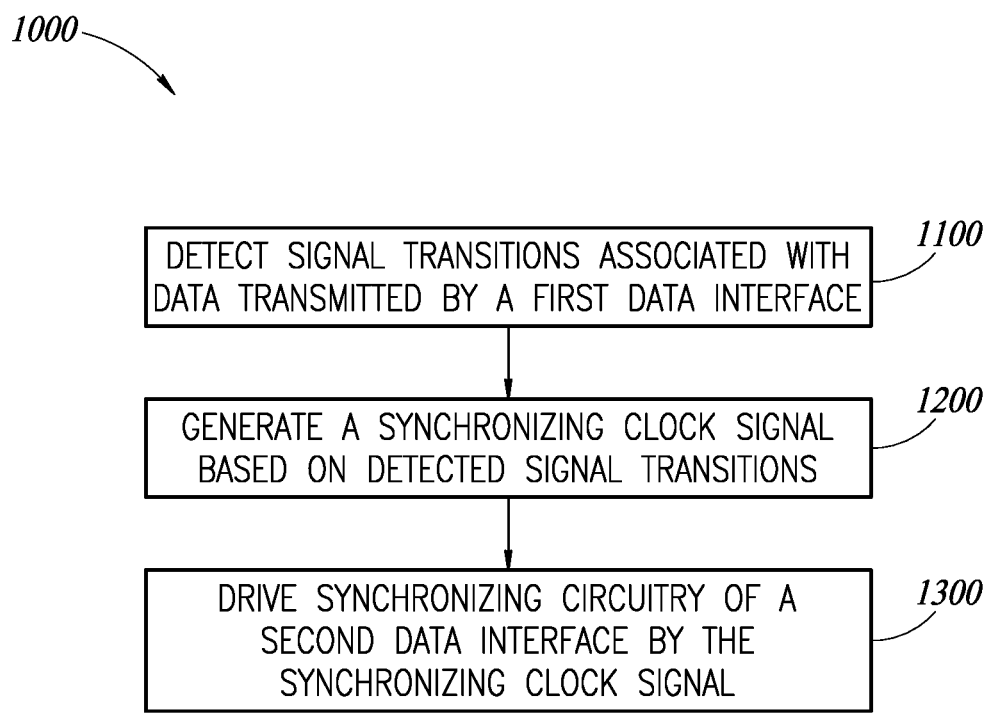
FIG. 6 is a flow diagram of a method of synchronizing data signals in accordance with various embodiments.

The transition detection circuitry 221(2) detects signal transitions associated with the input data signal D_IN transmitted by the data interface 130(1), corresponding to act 1100 of FIG. 6. The transition detection circuitry 221(2) includes XOR gates 320(1)-320(N) having inputs coupled to the input data lines 330(1)-330(N) and the output data lines 350(1)-350(N), respectively. The XOR gates 320(1)-320(N) generate logical XOR signals by performing logical XOR operations on the input data signals D_IN(1)-D_IN(N) and the corresponding output data signals D_OUT(1)-D_OUT(N). For example, the XOR gate 320(1) has input coupled to the input data line 330(1) and input coupled to the output data line 350(1), and generates a logical XOR signal by performing a logical XOR operation on the input data signal D_IN(1) and the output data signal D_OUT(1). When the value of the input data signal D_IN is the same as the value of the output data signal D_OUT, the logical XOR signals are low. When the value of the input data signal D_IN is different than the value of the output data signal D_OUT, one or more of the logical XOR signals is high.

The transition detection circuitry 221(2) includes an OR gate 322 having inputs coupled to outputs of the XOR gates 320(1)-320(N). The OR gate 322 outputs the transition detection signal TDS at an output of the OR gate 322. The transition detection signal TDS is generated by performing a logical OR operation on the logical XOR signals. When any of the XOR signals is high, corresponding to a change in the input data signal D_IN that has yet to be latched and synchronized, the transition detection signal TDS is high. When all of the XOR signals are low, corresponding to the input and output data signals D_IN, D_OUT being the same, the transition detection signal TDS is low. The transition detection circuitry 221(2) operates asynchronously.

Again with reference to FIG. 5, at second time t2, following transition of the value of the input data signal D_IN from "00" to "01," the transition detection signal TDS that has transitioned high (corresponding to act 1100 of FIG. 6) is latched by the latching circuitry 222(2) on a rising clock edge of the first clock signal CLK1. The latching circuitry 222(2) outputs the latched transition detection signal TDS_L at second time $t_2$, which is an indication of the transition of the input data signal D_IN.

The latching circuitry 222(2) is or comprises a flip-flop, as shown in FIG. 3. The latching circuitry 222(2) includes an input D, an output Q and a clock input CLK. The input D is coupled to the output of the OR gate 322 of the transition detection circuitry, and receives the transition detection signal TDS. The clock input CLK is associated with the first time domain, and receives a clock signal of the first time domain, such as the first clock signal CLK1 or a clock signal having the same frequency and derived from the first clock signal CLK1. The flip-flop generates at the output Q an output signal having the same logical polarity as an input signal at the input D on a rising edge of the first clock signal CLK1.

The gating circuitry 223(2) outputs the synchronizing clock signal Clk2_G at third time $t_3$ based on the latched transition detection signal TDS_L and the second clock signal CLK2, corresponding to act 1200 of FIG. 6. The gating circuitry 223(2) includes a pair of serially-coupled flip-flops 331, 333 and a clock gate 335. In one embodiment, additional flip-flops may be coupled between the flip-flops 331, 333 and the clock gate 335. Interconnection between, and operation of, the flip-flops 331, 333 are similar to those of the flip-flops 410, 420 described with reference to FIGS. 4A, 4B. The flip-flops 331, 333 output an enable signal EN used when generating the synchronizing clock signal Clk2_G. As shown in FIG. 5, multiple clock cycles of the second clock signal CLK2 pass between the second time $t_2$ and the third time $t_3$. The flip-flop 331 latches the latched transition detection signal TDS_L on a rising edge of the second clock signal CLK2 following the second time $t_2$. The flip-flop 333 outputs the enable signal EN by latching the output signal at the output Q of the flip-flop 331 on a subsequent rising edge of the second clock signal CLK2.

At the third time $t_3$, the clock gate 335 begins toggling the synchronizing clock signal Clk2_G based on the second clock signal CLK2 and the enable signal EN that is high, which drives the synchronizing circuitry 134(2) of the second data interface 130(2), corresponding to act 1300 of FIG. 6. The clock gate 335 may include an AND gate, a tri-state buffer, or other suitable circuitry that, in operation, toggles the synchronizing clock signal Clk2_G according to the second clock signal CLK2 when the enable signal EN is high, and outputs the synchronizing clock signal Clk2_G as low (e.g., does not toggle the synchronizing clock signal Clk2_G) when the enable signal EN is low. An enable input E of the clock gate 335 is coupled to the output Q of the flip-flop 333. A clock input CK of the clock gate 335 receives the second clock signal CLK2. An output of the clock gate 335 is coupled to clock inputs of the synchronizers 310(1)-310(N). The clock gate 335 generates the synchronizing clock signal Clk2_G that drives the synchronizers 310(1)-310(N).

At the third time $t_3$, the value of the input signal D_IN has transitioned to a value "01," while the output signal D_OUT has the original value "00." When the synchronizing clock signal Clk2_G is active (e.g., toggling) starting at the third time $t_3$, the flip-flop 410 of the synchronizer 310(1) latches the first input signal D_IN(1) on the first input data line 330(1) on a first rising edge of the synchronizing clock signal Clk2_G. FIG. 5 illustrates operation in which the synchronizer 310(1) has the configuration illustrated in FIG. 4A. At a fourth time $t_4$, on a second rising edge subsequent to the first rising edge, the flip-flop 420 generates the first output signal D_OUT(1) by latching the signal at the output Q of the flip-flop 410. In configurations using the synchronizer 310(1) shown in FIG. 4B, the flip-flop 420 may latch the signal at the output Q of the flip-flop 410 on a falling edge subsequent to the first rising edge. The synchronizing clock signal Clk2_G drives all synchronizers 310(1)-310(N) to output the output signal D_OUT having a value (e.g., "01") the same as the input signal D_IN that transitioned at the first time $t_1$.

Following transition of the output signal D_OUT to the same value as the input signal D_IN, outputs of the XOR gates 320(1)-320(N) go low, such that the transition detection signal TDS generated by the transition detection circuitry 221(2) goes low. At fifth time $t_5$, the latched transition detection signal TDS_L generated by the latching circuitry 222(2) goes low in response to the change to low in the transition detection signal TDS at a next rising edge of the first clock signal CLK1 following the transition of the output signal D_OUT to the same value as the input signal D_IN.

From the fifth time $t_5$ to a sixth time $t_6$, the synchronizing clock signal Clk2_G continues toggling while the flip-flops 331, 333 latch the latched transition detection signal TDS_L that has gone low over two clock cycles of the second clock signal CLK2. The synchronizing clock signal Clk2_G ceases toggling following transition of the enable signal EN from high to low corresponding to the flip-flop 333 latching the low value of the latched transition detection signal TDS_L.

As described with reference to FIG. 2, if a second transition were to occur in the input data signal D_IN following the fourth time $t_4$ and prior to the fifth time $t_5$, the transition detection signal TDS may go high before the rising edge of the first clock signal CLK1 at the fifth time $t_5$. As such, the latched transition detection signal TDS_L may remain high, and the synchronizing clock signal Clk2_G may continue toggling without ceasing.

Embodiments may provide advantages. As shown in FIG. 5, the synchronizing clock signal Clk2_G is active for a brief period following transition of the input data signal D_IN, and is quiet for a substantial portion of time between signal transitions. For input data signals D_IN that transition only infrequently, toggling of the synchronizers 310(1)-310(N) is greatly reduced, which dramatically lowers power consumption of the synchronizing data interface 200. The embodiments may be a boon to mobile devices for at least two reasons. Mobile devices integrate an increasing number of integrated circuit chips and IPs within a single chip or SoC, which implies the number of boundaries where signals cross clock domains increases, driving up the number of synchronizers deployed in any design. Mobile devices run on batteries, so power consumption is at a premium. Lowering power consumption of the synchronizing circuitry allows increased battery life, a greater number of synchronizing elements, or both.

In one embodiment, a device includes input data lines associated with a first time domain and output data lines associated with a second time domain. Synchronizing circuitry is coupled between the input data lines and output data lines. The synchronizing circuitry is driven by a synchronizing clock signal generated by clock generating circuitry. The clock generating circuitry is coupled to the input data lines and the synchronizing circuitry. In operation, the clock generating circuitry detects signal transitions on the plurality of input data lines. The clock generating circuitry generates the synchronizing clock signal that drives the synchronizing circuitry based on detected transitions, a clock signal of the first time domain, and a clock signal of the second time domain. In one embodiment, the clock generating circuitry includes transition detection circuitry, which in operation, generates a transition detection signal by logically combining signals on the plurality of input data lines with corresponding signals on the plurality of output data lines. In one embodiment, the transition detection circuitry includes a plurality of XOR gates coupled to the plurality of input data lines and the plurality of output data lines, and an OR gate coupled to outputs of the plurality of XOR gates. In one embodiment, the clock generating circuitry includes clock gating circuitry, which in operation outputs the synchronizing clock signal by logically combining the clock signal of the second time domain with an enable signal. In one embodiment, the clock generating circuitry includes a transition-latch flip-flop associated with the first time domain, which in operation generates an indication of a transition based on detected transitions. In one embodiment, the clock generating circuitry includes a synchronizer associated with the second time domain, which in operation synchronizes the indication. In one embodiment, the clock generating circuitry, in operation, disables the synchronizing clock signal between detected transitions, and the synchronizing circuitry, in operation, consumes less power when the synchronizing clock signal is disabled than enabled. In one embodiment, the synchronizing circuitry includes a plurality of half-cycle synchronizers.

In one embodiment, the clock generating circuitry includes transition detection circuitry. The transition detection circuitry, in operation, generates a transition detection signal by logically combining signals on the plurality of input data lines with corresponding signals on the plurality of output data lines. The transition detection circuitry includes a plurality of XOR gates coupled to the plurality of input data lines and the plurality of output data lines, and an OR gate coupled to outputs of the plurality of XOR gates. The clock generating circuitry includes clock gating circuitry. The clock gating circuitry, in operation, outputs the synchronizing clock signal by logically combining the clock signal of the second time domain with an enable signal. In one embodiment, the clock generating circuitry includes a first flip-flop associated with the first time domain, having an input coupled to an output of the OR gate. The clock generating circuitry includes a plurality of second flip-flops associated with the second time domain, the plurality of second flip-flops coupled together in series and having an input coupled to an output of the first flip-flop. The plurality of second flip-flops, in operation, generates the enable signal.

In one embodiment, a system includes first functional circuitry associated with a first time domain and second functional circuitry associated with a second time domain. In operation, the first functional circuitry transmits a plurality of signals to the second functional circuitry. A synchronizing interface has a plurality of synchronizing elements coupled between the first functional circuitry and the second functional circuitry. The synchronizing interface, in operation: detects signal transitions of the plurality of signals; and generates a synchronizing clock signal to drive the plurality of synchronizing elements based on detected transitions, a clock signal associated with the first time domain and a clock signal associated with the second time domain. In one embodiment, the synchronizing interface includes a plurality of input data lines coupled to the first functional circuitry, a plurality of output data lines coupled to the second functional circuitry, and transition detection circuitry. The transition detection circuitry, in operation, generates a transition detection signal by logically combining signals on the plurality of input data lines with corresponding signals on the plurality of output data lines. In one embodiment, the transition detection circuitry includes a plurality of XOR gates coupled to the plurality of input data lines and the plurality of output data lines, and an OR gate coupled to outputs of the plurality of XOR gates. In one embodiment, the synchronizing interface includes clock gating circuitry, which in operation generates the synchronizing clock signal by logically combining the clock signal of the second time domain with an enable signal. In one embodiment, the transition detection circuitry includes a latch element, which in operation synchronizes the transition detection signal to the first time domain. In one embodiment, the synchronizing interface includes a second synchronizing element associated with the second time domain coupled between the latch element and the clock gating circuitry. The second synchronizing element, in operation, generates the enable signal.

In one embodiment, a method includes transmitting data between first circuitry associated with a first time domain and second circuitry associated with a second time domain using a data interface. The transmitting includes: detecting signal transitions associated with the data; and generating a synchronizing clock signal to drive the data interface based on detected signal transitions, a clock signal associated with the first time domain, and a clock signal associated with the second time domain. In one embodiment, the detecting signal transitions includes generating a transition detection signal by logically combining signals on a plurality of input data lines of the data interface with corresponding signals on a plurality of output data lines of the data interface. In one embodiment, the generating a transition detection signal includes generating logical XOR signals by performing logical XOR operations on the signals on the plurality of input data lines and the corresponding signals on the plurality of output data lines, and performing a logical OR operation on the logical XOR signals. In one embodiment, the generating a synchronized clock signal includes logically combining the clock signal of the second time domain with an enable signal.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a plurality of input data lines associated with a first time domain;
a first clock input to receive a clock signal of the first time domain;
a plurality of output data lines associated with a second time domain;
a second clock input to receive a clock signal of the second time domain;
synchronizing circuitry coupled between the plurality of input data lines and the plurality of output data lines; and
clock generating circuitry coupled to the plurality of input data lines and the synchronizing circuitry, wherein the clock generating circuitry, in operation:
detects signal transitions on the plurality of input data lines; and
generates a synchronizing clock signal to drive the synchronizing circuitry based on detected transitions, the clock signal of the first time domain, and the clock signal of the second time domain.

2. The device of claim 1, wherein the clock generating circuitry includes:
transition detection circuitry, wherein the transition detection circuitry, in operation, generates a transition detection signal by logically combining signals on the plurality of input data lines with corresponding signals on the plurality of output data lines.

3. The device of claim 2, wherein the transition detection circuitry includes:
a plurality of XOR gates coupled to the plurality of input data lines and the plurality of output data lines; and
an OR gate coupled to outputs of the plurality of XOR gates.

4. The device of claim 1, wherein,
the clock generating circuitry includes clock gating circuitry, wherein the clock gating circuitry, in operation, outputs the synchronizing clock signal by logically combining the clock signal of the second time domain with an enable signal.

5. The device of claim 1, wherein
the clock generating circuitry includes a transition-latch flip-flop associated with the first time domain, wherein the transition-latch flip-flop, in operation, generates an indication of a transition based on detected transitions.

6. The device of claim 5, wherein
the clock generating circuitry includes a synchronizer associated with the second time domain, wherein the synchronizer, in operation, synchronizes the indication.

7. The device of claim 1, wherein
the clock generating circuitry, in operation, disables the synchronizing clock signal between detected transitions; and
the synchronizing circuitry, in operation, consumes less power when the synchronizing clock signal is disabled than enabled.

8. The device of claim 1, wherein the synchronizing circuitry includes a plurality of half-cycle synchronizers.

9. The device of claim 1, wherein the clock generating circuitry includes:
transition detection circuitry, wherein the transition detection circuitry, in operation, generates a transition detection signal by logically combining signals on the plurality of input data lines with corresponding signals on the plurality of output data lines, and the transition detection circuitry includes:
a plurality of XOR gates coupled to the plurality of input data lines and the plurality of output data lines; and
an OR gate coupled to outputs of the plurality of XOR gates; and
clock gating circuitry, wherein the clock gating circuitry, in operation, outputs the synchronizing clock signal by logically combining the clock signal of the second time domain with an enable signal.

10. The device of claim 9, wherein the clock generating circuitry includes:
a first flip-flop associated with the first time domain, having an input coupled to an output of the OR gate; and
a plurality of second flip-flops associated with the second time domain, the plurality of second flip-flops coupled together in series and having an input coupled to an output of the first flip-flop, wherein the plurality of second flip-flops, in operation, generates the enable signal.

11. A system, comprising:
first functional circuitry associated with a first time domain;
second functional circuitry associated with a second time domain, wherein, in operation, the first functional circuitry transmits a plurality of signals to the second functional circuitry; and
a synchronizing interface having a plurality of synchronizing elements coupled between the first functional circuitry and the second functional circuitry, wherein the synchronizing interface, in operation:
detects signal transitions of the plurality of signals; and
generates a synchronizing clock signal to drive the plurality of synchronizing elements based on detected transitions, a first clock signal associated with the first time domain and a second clock signal associated with the second time domain.

12. The system of claim 11, wherein the synchronizing interface includes:
a plurality of input data lines coupled to the first functional circuitry;
a first clock input to receive the first clock signal;
a plurality of output data lines coupled to the second functional circuitry;
a second clock input to receive the second clock signal; and
transition detection circuitry, wherein the transition detection circuitry, in operation, generates a transition detection signal by logically combining signals on the plurality of input data lines with corresponding signals on the plurality of output data lines.

13. The system of claim 12, wherein the transition detection circuitry includes:
a plurality of XOR gates coupled to the plurality of input data lines and the plurality of output data lines; and
an OR gate coupled to outputs of the plurality of XOR gates.

14. The system of claim 12, wherein the synchronizing interface includes clock gating circuitry, wherein the clock gating circuitry, in operation, generates the synchronizing clock signal by logically combining the second clock signal of the second time domain with an enable signal.

15. The system of claim 14, wherein the transition detection circuitry includes a latch element, wherein the latch element, in operation, synchronizes the transition detection signal to the first time domain.

16. The system of claim 15, wherein the synchronizing interface includes a second synchronizing element associated with the second time domain coupled between the latch element and the clock gating circuitry, wherein the second synchronizing element, in operation, generates the enable signal.

17. A method, comprising:
transmitting data between first circuitry associated with a first time domain and second circuitry associated with a second time domain using a data interface, the transmitting including:
detecting signal transitions associated with the data interface; and
generating a synchronizing clock signal to drive the data interface based on detected signal transitions, a first clock signal associated with the first time domain, and a second clock signal associated with the second time domain.

18. The method of claim 17, wherein the detecting signal transitions includes generating a transition detection signal by logically combining signals on a plurality of input data lines of the data interface with corresponding signals on a plurality of output data lines of the data interface.

19. The method of claim 18, wherein the generating a transition detection signal includes:
generating logical XOR signals by performing logical XOR operations on the signals on the plurality of input data lines and the corresponding signals on the plurality of output data lines; and performing a logical OR operation on the logical XOR signals.

20. The method of claim 17, wherein
the generating a synchronized clock signal includes logically combining the second clock signal of the second time domain with an enable signal.

\* \* \* \* \*